United States Patent Office 3,830,742

Patented Aug. 20, 1974

3,830,742

PIEZOELECTRIC CERAMIC COMPOSITIONS

Masamitsu Nishida, Osaka, and Hiromu Ouchi, Toyonaka, Japan, assignors to Matsushita Electric Industrial Co. Ltd., Kadoma, Osaka, Japan No Drawing. Filed Dec. 27, 1971, Ser. No. 212,691

Claims priority, application Japan, Jan. 7, 1971, 46/190

Int. Cl. C04b *35/46, 35/48*

U.S. Cl. 252—62.9 2 Claims

ABSTRACT OF THE DISCLOSURE

Piezoelectric ceramic compositions having high piezoelectric constants and high durabilities of the piezoelectric constants with cycling of mechanical stress, and comprising the quaternary system $Pb(Zn_{1/3}Nb_{2/3})O_3$-$Pb(Sn_{1/3}Nb_{2/3})O_3$-$PbTiO_3$-$PbZrO_3$.

BACKGROUND OF THE INVENTION

This invention relates to piezoelectric ceramic compositions and articles of manufacture fabricated therefrom. More particularly, the present invention pertains to novel ferroelectric ceramics which are polycrystalline aggregates of certain constituents. These piezoelectric compositions are sintered into ceramics by ordinary ceramic techniques and thereafter the ceramics are polarized by applying a D.C. voltage between electrodes to impart thereto electromechanical transducing properties similar to the well-known piezoelectric effect. The invention also encompasses the calcined intermediate product of raw ingredients and the articles of manufacture such as electromechanical transducers fabricated from the sintered ceramic.

The use of piezoelectric materials in various transducer applications in the production, measurement and sensing of sound, shock, vibration, pressure, and high voltage generation etc. have increased greatly in recent years. Both crystal and ceramic types of transducers have been widely used. But, because of their potentially lower cost and ease of use in the fabrication of ceramics of various shapes and sizes and their greater durability at high temperatures and/or high humidities than crystalline substances such as Rochelle salt, etc., piezoelectric ceramic materials have recently come into prominent use in various transducer applications.

The piezoelectric characteristics required of ceramics apparently vary depending upon the intended application. For example, electrochemical transducers such as phonograph pick-up and microphone elements require piezoelectric ceramics characterized by a substantially high electromechanical coupling coefficient and dielectric constant. On the other hand, in the ceramic filter and piezoelectric transformer applications of piezoelectric ceramics it is desirable that the materials exhibit a higher value of mechanical quality factor and a high electromechanical coupling coefficient. Furthermore, ceramic materials require a high stability in dielectric constant and in other electrical properties over wide temperature and time ranges. Also, electromechanical transducers such as a ceramic igniter element applied as a spark source for gas require piezoelectric ceramics characterized by high piezoelectricity, high mechanical strength and great durability of output voltage with cycling of mechanical stress.

As a promising ceramic for these applications, lead titanate-lead zirconate has been in wide use up to now. However, it is difficult to obtain a high durability of the piezoelectric constant with cycling of mechanical stress along with a high piezoelectric constant in the conventional lead titanate-lead zirconate ceramics. Moreover, the dielectric and piezoelectric properties of the lead titanate-lead zirconate ceramics vary greatly depending upon the firing technique employed due to the evaporation of PbO. Improvement of these factors has been made by incorporating various additional constituents into the basic ceramic composition or by incorporating various complex compounds. For example, U.S. Pat. 2,911,370 relates to lead titanate zirconate ceramics modified with $Nb_2O_5$, $Ta_2O_5$ and $Y_2O_3$ etc., and U.S. Pat. 3,403,103 relates to ternary system $Pb(Zn_{1/3}Nb_{2/3})O_3$-$PbTiO_3$-$PbZrO_3$ ceramics. These ceramics exhibit high electromechanical coupling coefficients but exhibit low durabilities of the piezoelectric constants with mechanical stress.

OBJECTS AND SUMMARY OF THE INVENTION

It is, therefore, the fundamental object of the present invention to provide novel and improved piezoelectric ceramic materials which overcome the problems outlined above. A specific object of the invention is to provide improved polycrystalline ceramics characterized by high piezoelectric constants.

A more specific object of the invention is the provision of novel piezoelectric ceramics characterized by high durability of the piezoelectric constant with cycling of mechanical stress.

Another object of the invention is the provision of novel piezoelectric ceramics characterized by great durability of output voltage with cycling of mechanical impact on a ceramic igniter element applied as a spark source for gas.

Still another object of the invention is the provision of novel piezoelectric ceramics characterized by high mechanical strength.

A further object of the invention is the provision of novel piezoelectric ceramic compositions, certain properties of which can be varied to suit various applications.

A still further object of the invention is the provision of improved electromechanical transducers utilizing, as the active elements, electrostatically polarized bodies composed of these novel ceramic compositions.

These objects are achieved by providing ceramic bodies which exist basically in the material comprising the quaternary system $Pb(Zn_{1/3}Nb_{2/3})O_3$-$Pb(Sn_{1/3}Nb_{2/3})O_3$-$PbTiO_3$-$PbZrO_3$.

DETAILED DESCRIPTION OF THE INVENTION

The present invention is based on the discovery that within certain particular compositional ranges of this system the specimens exhibit very high piezoelectric constants and high durability of the piezoelectric constant with mechanical stress.

The ceramic compositions of the present invention have various advantages in the processes for their manufacture and in their application for ceramic transducers. It has been known that the evaporation of PbO during firing is a problem encountered in the sintering of lead compounds such as lead titanate-zirconate. The compositions of the invention evidence a smaller amount of evaporated PbO than the usual lead titanate-zirconates upon firing. The quaternary system can be fired in the absence of a PbO atmosphere. A well sintered body according to the present composition is obtained by firing the above described compositions in a ceramic crucible covered with a ceramic cover made of $Al_2O_3$ ceramics. A high sintered density is desirable for resistance to humidity and high piezoelectric response when the sintered body is utilized as a resonator and for other applications.

Some compositions coming within the quaternary system $Pb(Zn_{1/3}Nb_{2/3})O_3$-$Pb(Sn_{1/3}Nb_{2/3})O_3$-$PbTiO_3$-$PbZrO_3$ do not exhibit high piezoelectricity, and many are electropolished to form columns of 7 mm. in diameter and 15 mm. in length. Both sides of the polished columns were then coated with silver paint and fired to form silver electrodes. The columns were polarized while immersed in a bath of silicone oil at 100–150° C. A voltage gradient of D.C. 2–3 kv. per mm. was maintained for 30 minutes.

The piezoelectric and dielectric properties of the polarized specimen were measured at 20° C. in a relative humidity of 50% and at a frequency of 1 kHz. Examples of specific ceramic compositions according to this invention and various pertinent dielectric property, piezoelectric property and mechanical property are given in Table 1.

TABLE I

| Example number | Compositions | Dielectric constant, $\epsilon$ | Bending strength (kg./cm.²) | Piezoelectric constant, $G_{33}\times10^3$ V–M/N: Before impact | After impact |
|---|---|---|---|---|---|
| 1 | $Pb(Zn_{1/3}Nb_{2/3})_{0.04}(Sn_{1/3}Nb_{2/3})_{0.02}Ti_{0.46}Zr_{0.48}O_3$ | 1,640 | 1,150 | 27.6 | 25.9 |
| 2 | $Pb(Zn_{1/3}Nb_{2/3})_{0.03}(Sn_{1/3}Nb_{2/3})_{0.09}Ti_{0.44}Zr_{0.43}O_3$ | 1,710 | 1,130 | 28.8 | 27.2 |
| 3 | $Pb(Zn_{1/3}Nb_{2/3})_{0.06}(Sn_{1/3}Nb_{2/3})_{0.06}Ti_{0.44}Zr_{0.44}O_3$ | 1,620 | 1,240 | 27.7 | 26.1 |
| 4 | $Pb(Zn_{1/3}Nb_{2/3})_{0.25}(Sn_{1/3}Nb_{2/3})_{0.02}Ti_{0.37}Zr_{0.37}O_3$ | 1,670 | 1,190 | 27.2 | 25.5 |
| 5 | $Pb(Zn_{1/3}Nb_{2/3})_{0.03}(Sn_{1/3}Nb_{2/3})_{0.15}Ti_{0.41}Zr_{0.41}O_3$ | 1,590 | 1,180 | 28.0 | 26.2 |

mechanically active only to a slight degree. The present invention is concerned only with the compositions represented by the formula $$Pb(Zn_{1/3}Nb_{2/3})_A(Sn_{1/3}Nb_{2/3})_BTi_CZr_DO_3,$$

wherein A, B, C, and D respectively have the following molar ratio 0.03–0.50, 0.01–0.25, 0.25–0.625 and 0.25–0.625, and $A+B+C+D=1$, and exhibiting piezoelectric response of appreciable magnitude.

The compositions described herein may be prepared in accordance with various well-known ceramic procedures. A preferred method, however, hereinafter more fully described, contemplates the use of PbO or $Pb_3O_4$, ZnO, $SnO_2$, $Nb_2O_5$, $TiO_2$, $ZrO_2$, as starting materials.

EXAMPLE

The starting materials, viz., lead oxide (PbO), zinc oxide (ZnO), stannic oxide ($SnO_2$), niobia ($Nb_2O_5$), titania ($TiO_2$), and zirconia ($ZrO_2$), all of relatively pure grade (e.g. C.P. grade) are intimately mixed in a rubber-lined ball mill with distilled water. In milling the mixture care should be exercised to avoid contamination thereof due to wear of the milling ball or stones. This may be avoided by varying the proportions of the starting materials to compensate for any contamination.

Following the wet milling, the mixture is dried and mixed to insure as homogeneous a mixture as possible. Thereafter, the mixture is suitably formed into desired forms at a pressure of 400 kg./cm.². The compacts are then pre-reacted by a calcination at a temperature of about 850° C. for about 2 hours.

After calcination, the reacted material is allowed to cool and is then wet milled to a small particle size. Once again, care should be exercised as above to avoid contamination by wear of the milling balls or stones. Depending on preference and the shapes desired, the material may be formed into a mix or slip suitable for pressing, slip casting, or extruding, as the case may be, in accordance with conventional ceramic forming procedures. The milled powder was then pressed into columns of 10 mm. in diameter and 20 mm. in length at a pressure of 700 kg./cm.². The pressed discs were fired at 1200–1300° C. for 45 minutes. According to the present invention, there is no need to fire the composition in an atmosphere of PbO. Moreover, there is no need to maintain a special temperature gradient in the firing furnace as is necessary in prior art procedures. Thus, according to the present invention, uniform and excellent piezoelectric ceramic products can be easily obtained simply by covering the samples with an alumina crucible during firing. The sintered ceramics were The piezoelectric constant after impact was measured after $10^7$ mechanical impacts at a pressure of 400 kg./cm.².

From Table I it will be evident that all exemplary compositions are characterized by high durability of the piezoelectric constant with cycling of mechanical impact. Therefore, the ceramics of this invention exhibit great durability of output voltage with cycling of mechanical impact on a ceramic igniter element applied as a spark source for gas. This property is important to the use of piezoelectric ceramics as ceramic igniters, etc. According to the invention, for example, the change of output voltage of the ceramic igniter unit having the composition of Example No. 3 with $3\times10^4$ mechanical impacts at a pressure of 400 kg./cm.² was 1.3%.

According to the present invention, the piezoelectric ceramics have high piezoelectricity. Therefore, the ceramics of the invention are also suitable for use in electromechanical transducer elements such as photograph pickups, microphones and voltage generators in ignition systems. It is desirable in these applications of the ceramics that the piezoelectric ceramics exhibit a high mechanical strength in order that products employing the ceramics exhibit high reliability over wide time ranges and in high mechanical stress.

In addition to the superior properties shown above, compositions according to the present invention yield ceramics of good physical quality and which polarize well. It will be understood from the foregoing that the quaternary system $$Pb(ZN_{1/3}Nb_{2/3})O_3\text{-}Pb(Sn_{1/3}Nb_{2/3})O_3\text{-}PbTiO_3\text{-}PbZrO_3$$

form excellent piezoelectric ceramic bodies.

It will be evident that the starting materials to be used in this invention are not limited to those used in the above examples. Those oxides may be used, in place of the starting materials of the above examples, which are easily decomposed at elevated temperatures to form the required compositions.

While there have been described what at present are believed to be the preferred embodiments of this invention, it will be obvious that various changes and modifications can be made therein without departing from the spirit or scope of the invention.

What is claimed is:

1. A piezoelectric ceramic composition consisting essentially of a material represented by the formula:

$$Pb(Zn_{1/3}Nb_{2/3})_A(Sn_{1/3}Nb_{2/3})_BTi_CZr_DO_3$$

wherein the ranges for A, B, C and D are A=0.03–0.50,

B=0.01–0.25, C=0.25–0.625, D=0.25–0.625, and wherein $A+B+C+D=1$.

2. A piezoelectric ceramic composition consisting essentially of a material represented by the formula:

$$Pb(Zn_{1/3}NB_{2/3})_{0.06}(SN_{1/3}NB_{2/3})_{0.06}Ti_{0.44}Zr_{0.44}O_3.$$

References Cited

UNITED STATES PATENTS

| | | | |
|---|---|---|---|
| 3,403,103 | 9/1968 | Ouchi et al. -------- | 252—62.9 |
| 3,528,918 | 9/1970 | Nishida et al. ------- | 252—62.9 |
| 3,594,321 | 7/1971 | Ohno et al. --------- | 252—62.9 |
| 3,637,506 | 1/1972 | Tanizake et al. ------ | 252—62.9 |

JACK COOPER, Primary Examiner